United States Patent
Song et al.

(10) Patent No.: US 8,735,873 B2
(45) Date of Patent: May 27, 2014

(54) ORGANIC LIGHT EMITTING DIODE

(75) Inventors: Ki-Woog Song, Imsil-gun (KR); SungHoon Pieh, Seoul (KR)

(73) Assignee: LG Display Co., Ltd., Seoul (KR)

(*) Notice: Subject to any disclaimer, the term of this patent is extended or adjusted under 35 U.S.C. 154(b) by 205 days.

(21) Appl. No.: 13/249,674

(22) Filed: Sep. 30, 2011

(65) Prior Publication Data
US 2013/0015489 A1    Jan. 17, 2013

(30) Foreign Application Priority Data
Jul. 11, 2011 (KR) .................. 10-2011-0068489

(51) Int. Cl.
*H01L 29/08* (2006.01)

(52) U.S. Cl.
USPC .................. 257/40; 257/E51.018

(58) Field of Classification Search
CPC .............................. H01L 51/0545
USPC .......................... 257/40, E51.018
See application file for complete search history.

(56) References Cited

U.S. PATENT DOCUMENTS

| | | | |
|---|---|---|---|
| 6,967,062 B2* | 11/2005 | Hatwar et al. | 428/690 |
| 2002/0034659 A1* | 3/2002 | Nishi et al. | 428/690 |
| 2004/0155238 A1 | 8/2004 | Thompson et al. | |
| 2006/0040132 A1* | 2/2006 | Liao et al. | 428/690 |
| 2007/0069638 A1* | 3/2007 | Matsuura et al. | 313/504 |
| 2008/0102310 A1 | 5/2008 | Thompson et al. | |
| 2011/0073844 A1 | 3/2011 | Pieh et al. | |
| 2011/0121320 A1 | 5/2011 | Pieh et al. | |
| 2011/0233604 A1 | 9/2011 | Ikeda | |

FOREIGN PATENT DOCUMENTS

| | | |
|---|---|---|
| KR | 20070101516 | 10/2007 |
| KR | 100852122 B1 | 8/2008 |
| KR | 20100073417 A | 7/2010 |
| WO | 02/15645 A1 | 2/2002 |
| WO | 02/074015 A2 | 9/2002 |
| WO | 2008/131750 A2 | 11/2008 |

OTHER PUBLICATIONS

Kondakov, 41.4: Role of Triplet-Triplet Annihilation in Highly Efficient Fluorescent Devices, SID 08 Digest, vol. 39, pp. 617-620, 2008.
Official Communication dated Mar. 8, 2013, German Patent Application No. 102011054604.9.

* cited by examiner

*Primary Examiner* — Matthew Reames
(74) *Attorney, Agent, or Firm* — Morgan, Lewis & Bockius LLP (57) ABSTRACT

An organic light emitting diode includes: a first electrode; a first hole transporting layer on the first electrode; a first emitting material layer on the first hole transporting layer, the first emitting material layer including a first host with a first dopant, wherein an energy level of a lowest unoccupied molecular orbital of the first dopant is higher than an energy level of a lowest unoccupied molecular orbital of the first host; a first electron transporting layer on the first emitting material layer; and a second electrode on the first electron transporting layer, wherein an energy level of each of the first hole transporting layer and the first electron transporting layer is higher than an energy level of a triplet state exciton of the first emitting material layer.

17 Claims, 8 Drawing Sheets

ORGANIC LIGHT EMITTING DIODE

The present application claims the benefit of Korean Patent Application No. 10-2011-0068489 filed in Korea on Jul. 11, 2011, which is hereby incorporated by reference in its entirety.

BACKGROUND OF THE INVENTION

1. Field of the Invention

The present invention relates to an organic light emitting diode (OLED), and more particularly, to an organic light emitting diode having improved luminous efficiency and lifespan.

2. Discussion of the Related Art

Although a cathode ray tube (CRT) was widely used as a display device, flat panel displays (FPDs), such as a plasma display panel (PDP), a liquid crystal display (LCD) and an organic light emitting diode (OLED) display device, have been recently researched and used. Among various FPDs, an OLED display device does not include a backlight unit required in an LED device having an emissive type because the OLED display device has a non-emissive type. As a result, the OLED display device has a light-weight and thin profile. In addition, the OLED display device has advantages in a viewing angle, a contrast ratio and power consumption as compared to the LCD device. Moreover, the OLED display device has a low direct current (DC) driving voltage and a fast response speed. Furthermore, since the inner components of the OLED display device are in a solid state, the OLED display device is resistant to an external impact and has a wide temperature range of usage. Specifically, since fabrication process is simple, the product cost of an OLED display device is less than that of an LCD device.

Figure 1:
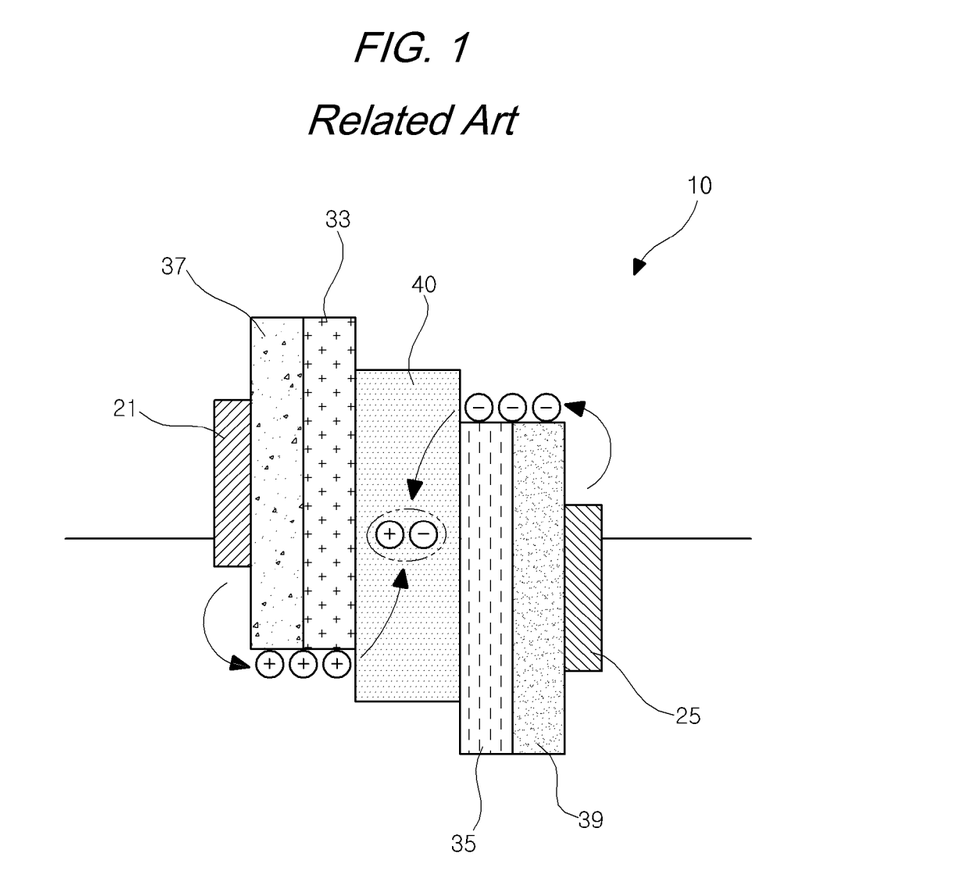
FIG. 1 is an energy band diagram showing an organic light emitting diode according to the related art.

The OLED display device is an emissive type display device including an organic light emitting diode that emits a light through an organic emitting phenomenon. FIG. 1 is an energy band diagram showing an organic light emitting diode according to an related art. In FIG. 1, an organic light emitting diode 10 includes an anode 21, a cathode 25, a hole transporting layer (HTL) 33, an electron transporting layer (ETL) 35 and an emitting material layer (EML) 40. In addition, for the purpose of improving luminous efficiency, a hole injection layer (HIL) 37 is formed between the anode 21 and the HTL 33, and an electron injection layer (EIL) 39 is formed between the cathode 25 and the ETL 35.

When a high level voltage and a low level voltage are applied to the anode 21 and the cathode 25, respectively, of the organic EL diode 10, a hole of the anode 21 and an electron of the cathode 25 are transferred to the EML 40 to form an exciton. When the exciton transitions from an excited state to a ground state, a light is generated and the EML 40 emits the light.

The exciton may have a singlet state and a triplet state such that a ratio of existence probabilities of the singlet state and the triplet state is about 1:3. Since the OLED emits a light when the exciton transitions from the singlet state to the ground state, the OLED has a disadvantage that its internal quantum efficiency is not greater than about 25% theoretically. Accordingly, an OLED utilizing higher internal quantum efficiency of the triplet state (e.g. at least about 75%) would be desirable.

SUMMARY OF THE INVENTION

The present invention is directed to an organic light emitting diode having improved luminous efficiency and lifespan.

Additional features and advantages of the invention is set forth in the following description, and in part is apparent from the description, or may be learned by practicing of the invention. The objectives and other advantages of the invention can be realized and attained by the structures particularly pointed out in the written description and claims hereof as well as the appended drawings.

To achieve these and other advantages and in accordance with the purpose according to one aspect of the present invention, as embodied and broadly described herein, an organic light emitting diode may include: a first electrode; a first hole transporting layer on the first electrode; a first emitting material layer on the first hole transporting layer, the first emitting material layer including a first host with a first dopant, wherein an energy level of a lowest unoccupied molecular orbital of the first dopant is higher than an energy level of a lowest unoccupied molecular orbital of the first host; a first electron transporting layer on the first emitting material layer; and a second electrode on the first electron transporting layer, wherein an energy level of each of the first hole transporting layer and the first electron transporting layer is higher than an energy level of a triplet state exciton of the first emitting material layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the present invention.

Figure 2:
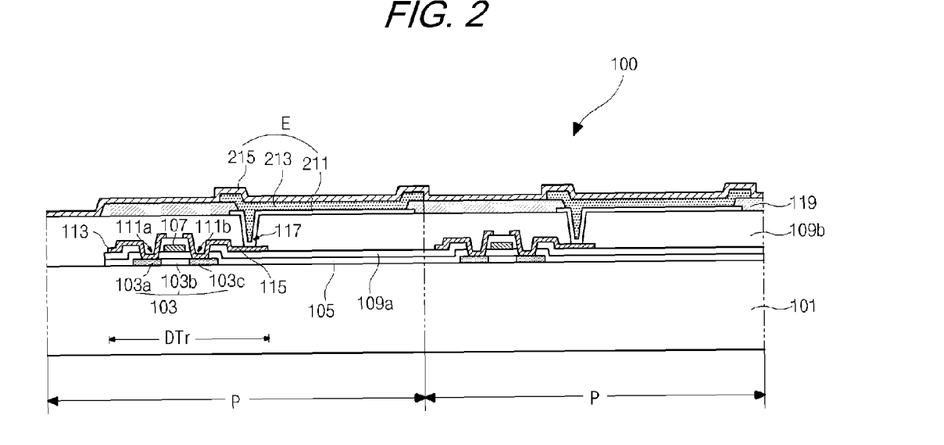
FIG. 2 is a cross-sectional view showing an organic light emitting diode display device according to a first embodiment of the present invention.
Figure 3:
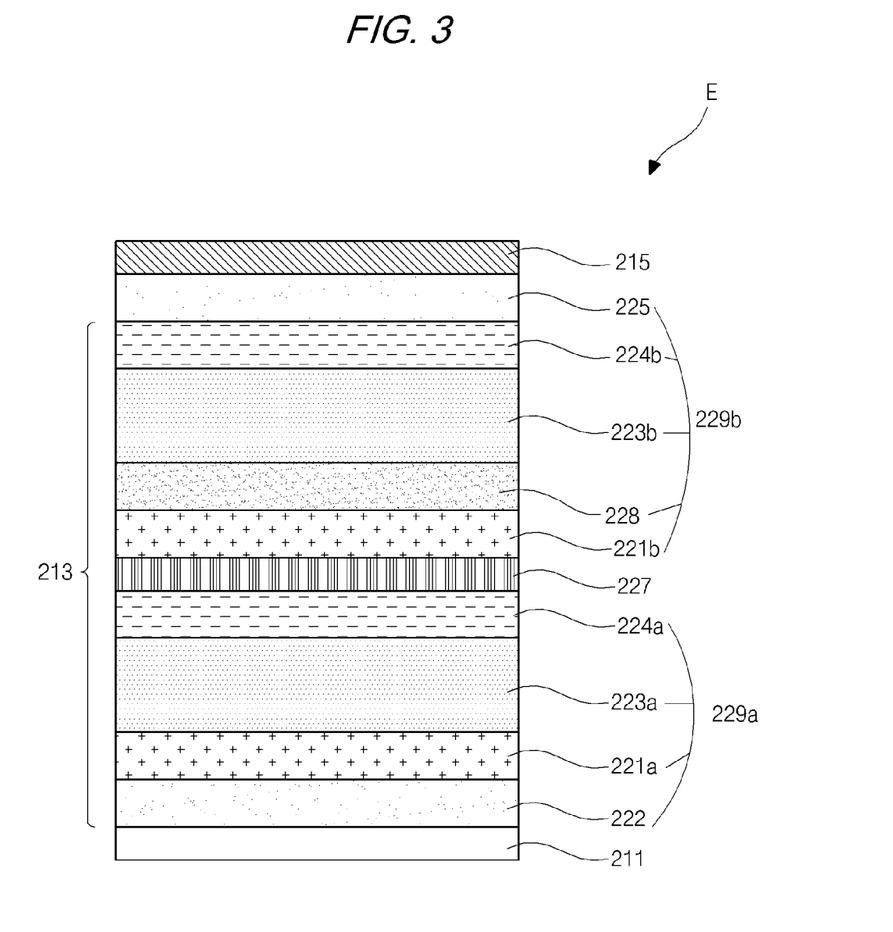
FIG. 3 is a cross-sectional view showing an organic light emitting diode according to a first embodiment of the present invention.

FIG. 2 is a cross-sectional view showing an organic light emitting diode display device according to a first embodiment of the present invention, and FIG. 3 is a cross-sectional view showing an organic light emitting diode according to a first embodiment of the present invention.

In FIG. 2, an organic light emitting diode (OLED) display device 100 includes a driving thin film transistor (TFT) DTr and an organic light emitting diode E in a pixel region P. A semiconductor layer 103 is formed in the pixel region P on a first substrate 101. The semiconductor layer 103 may include (i) an active region 103b at a center thereof and (ii) source and drain regions 103a and 103c at sides of the active region 103b. The active region 103b may include intrinsic silicon, and the source and drain regions 103a and 103c may include impurity-doped silicon. In addition, a gate insulating layer 105 is formed on the semiconductor layer 103.

A gate electrode 107 and a gate line (not shown) are formed on the gate insulating layer 105. The gate electrode 107 corresponds to the active region 103b of the semiconductor layer 103 and is connected to the gate line. An interlayer insulating layer 109a is formed on the gate electrode 107 and the gate line. The interlayer insulating layer 109a and the gate insulating layer 105 have first and second semiconductor contact holes 111a and 111b exposing the source and drain regions 103a and 103c, respectively.

Source and drain electrodes 113 and 115 are formed on the interlayer insulating layer 109a. The source and drain electrodes 113 and 115 are spaced apart from each other. The source electrode 113 is connected to the source region 103a through the first semiconductor contact hole 111a and the drain electrode 115 is connected to the drain region 103c through the second semiconductor contact hole 111b. A passivation layer 109b is formed on the source and drain electrodes 113 and 115. The passivation layer 109b has a drain contact hole 117 exposing the drain electrode 115.

The semiconductor layer 103 having the source and drain regions 103a and 103c, the gate insulating layer 105, the gate electrode 107, the source electrode 113 and the drain electrode 115 constitute the driving TFT DTr.

Although not shown, a data line that crosses the gate line to define the pixel region P is formed on the interlayer insulating layer 109a. In addition, a switching TFT that has the same structure as the driving TFT DTr and is connected to the driving TFT DTr is formed in the pixel region P. Although the driving TFT DTr and the switching TFT have a top gate structure where the semiconductor layer 103 is formed of polycrystalline silicon in FIG. 2, the driving TFT DTr and the switching TFT may have a bottom gate structure where the semiconductor layer is formed of amorphous silicon.

A first electrode 211, an organic luminescent layer 213 and a second electrode 215 constituting an organic light emitting diode (OLED) E are sequentially formed on the passivation layer 109b. The first electrode 211 is connected to the drain electrode 115 of the driving TFT DTr through the drain contact hole 117 in the passivation layer 109b. Here, the first electrode 211 may be formed of a material having a relatively high work function, including, but not limited to, indium-tin-oxide (ITO), to function as an anode, and the second electrode 215 may be formed of a material having a relatively low work function, including, but not limited to, a single layer of aluminum (Al), calcium (Ca) or magnesium (Mg), or a double layer of lithium fluoride (LiF)/aluminum (Al), to function as a cathode. In addition, a light from the organic luminescent layer 213 is emitted through the second electrode 215 so that the OLED display device 100 can be driven in a top emission type.

The organic luminescent layer 213 may include a hole injection layer (HIL), a hole transporting layer (HTL), an emitting material layer (EML), an electron transporting layer (ETL) and an electron injection layer (EIL). Since the light from the organic luminescent layer 213 has to pass through the second electrode 215, the second electrode 215 may have a double-layered structure including a lower thin layer of a metallic material having a relatively low work function and an upper thick layer of a transparent conductive material having a relatively high work function.

In the OLED display device 100, when voltages corresponding to an image signal are applied to the first and second electrodes 211 and 215, a hole injected from the first electrode 211 and an electron injected from the second electrode 215 are transferred to the organic luminescent layer 213 to form an exciton. In addition, when the exciton transitions from an excited state to a ground state, a light is generated and is emitted as a visible ray through the second electrode 215 so that the OLED display device 100 can display images. The first electrode 211 is formed in each pixel region P, and a bank layer 119 is formed between two adjacent first electrodes 211.

A luminous efficiency of the OLED display device 100 significantly increases (e.g. by more than about 20%), and a lifespan of the OLED display device 100 also significantly increases (e.g. by more than about 50%) as compared to the related art OLED display device because a luminous efficiency of the organic luminescent layer 213 of the OLED E is improved.

In FIG. 3, the OLED E includes the first electrode 211 as an anode, a first stack 229a, a charge generating layer (CGL) 227, a second stack 229b and the second electrode 215 as a cathode. The CGL 227 may be formed of a material having a property of relatively low optical and electrical losses including, for example, a metallic material, an oxide material, an organic material and a multiple layer thereof.

The first stack 229a includes a first HIL 222, a first HTL 221a, a first EML 223a and a first ETL 224a between the first electrode 211 and the CGL 227, and the second stack 229b includes a second HTL 221b, an exciton blocking layer EBL 228, a second EML 223b, a second ETL 224b and an EIL 225 between the CGL 227 and the second electrode 215.

The first EML 223a may include a single blue host with a blue fluorescent dopant, and the second EML 223b may include a single host with a red phosphorescent dopant and a green phosphorescent dopant. As a result, the OLED E may emit a white light by combination of red, green and blue lights of the first and second EMLs 223a and 223b. Alternatively, the second EML 223b may include a single host with a yellow dopant, and the OLED E may emit a white light by combination of blue and yellow lights of the first and second EMLs 223a and 223b. Accordingly, when the OLED display device 100 is driven, a white light can be emitted by combination of the lights from the first and second EMLs 223a and 223b.

Each of the second HTL 221b and the second ETL 224b is formed to have an energy level higher than an energy level of the triplet state exciton of the second EML 223b. For example, the energy level of each of the second HTL 221b and the second ETL 224b may be higher than the energy level of the triplet state exciton of the second EML 223b by about 0.001 eV to about 0.5 eV. Since the energy level of each of the second HTL 221b and the second ETL 224b is higher than the energy level of the triplet state exciton of the second EML 223b, the triplet state exciton of the second EML 223b is prevented from moving to one of the second HTL 221b and the second ETL 224b. As a result, reduction in luminous efficiency is prevented.

In addition, each of the first HTL 221a and the first ETL 224a is formed to have an energy level higher than an energy level of the triplet state exciton of the first EML 223a. For example, the energy level of each of the first HTL 221a and the first ETL 224a may be higher than the energy level of the triplet state exciton of the first EML 223a by about 0.001 eV to about 0.5 eV. Since the energy level of each of the first HTL 221a and the first ETL 224a is higher than the energy level of the triplet state exciton of the first EML 223a, the triplet state exciton of the first EML 223a is prevented from moving to one of the first HTL 221a and the first ETL 224a. As a result, reduction in luminous efficiency is prevented.

In the OLED display device 100, the energy level (i.e., high triplet energy level) of each of the first HTL 221a and the first ETL 224a is higher than the energy level of the triplet state exciton of the first EML 223a and the energy level of each of the second HTL 221b and the second ETL 224b is higher than the energy level of the triplet state exciton of the second EML 223b. Accordingly, the triplet state exciton of the first and second EMLs 223a and 223b is prevented from moving to upper and lower layers thereof and is effectively used for emission.

In some embodiments, since the first EML 223a includes a fluorescent material, and each of the first HTL 221a and the first ETL 224a is formed to have a high triplet energy level, the triplet state exciton generated in the first EML 223a transitions to the singlet state exciton due to interaction between the triplet state excitons. Similarly, since the second EML 223b includes a phosphorescent material, and each of the second HTL 221b and the second ETL 224b is formed to have a high triplet energy level, the triplet state exciton generated in the second EML 223b transitions to the singlet state exciton due to interaction between the triplet state excitons. When the hole and the electron meet to form the exciton in each of the first and second EMLs 223a and 223b, an existence probability ratio of the singlet state exciton and the triplet state exciton may be about 1:3. While the singlet state exciton transitions to the ground state to emit a light (fluorescence or phosphorescence), the triplet state exciton transitions to the ground state to emit a heat instead of a light.

In the OLED display device 100, since each of the first and second HTLs 221a and 221b and the first and second ETLs 224a and 224b has the high triplet energy level, the triplet state exciton is confined in each of the first and second EMLs 223a and 223b and a portion of the triplet state exciton transitions to the singlet state due to collision of triplet state excitons (triplet-triplet annihilation (TTA)) to emit a light (delayed fluorescence or delayed phosphorescence). Since the portion of the triplet state exciton transitions to the singlet state to contribute to emission, the internal quantum efficiency and the luminous efficiency are improved. Specifically, since the lifespan of the triple state exciton is longer than the lifespan of the singlet state exciton, the delayed fluorescence and the delayed phosphorescence are obtained by emission due to collision and transition of the triplet state exciton. Further, luminous efficiency of the OLED display device 100 is further improved by the delayed fluorescence and the delayed phosphorescence. For example, the luminous efficiency of the OLED display device 100 may increase by more than about 20% and the lifespan of the OLED display device 100 may increase by more than about 50% as compared with the related art OLED display device.

Figure 4:
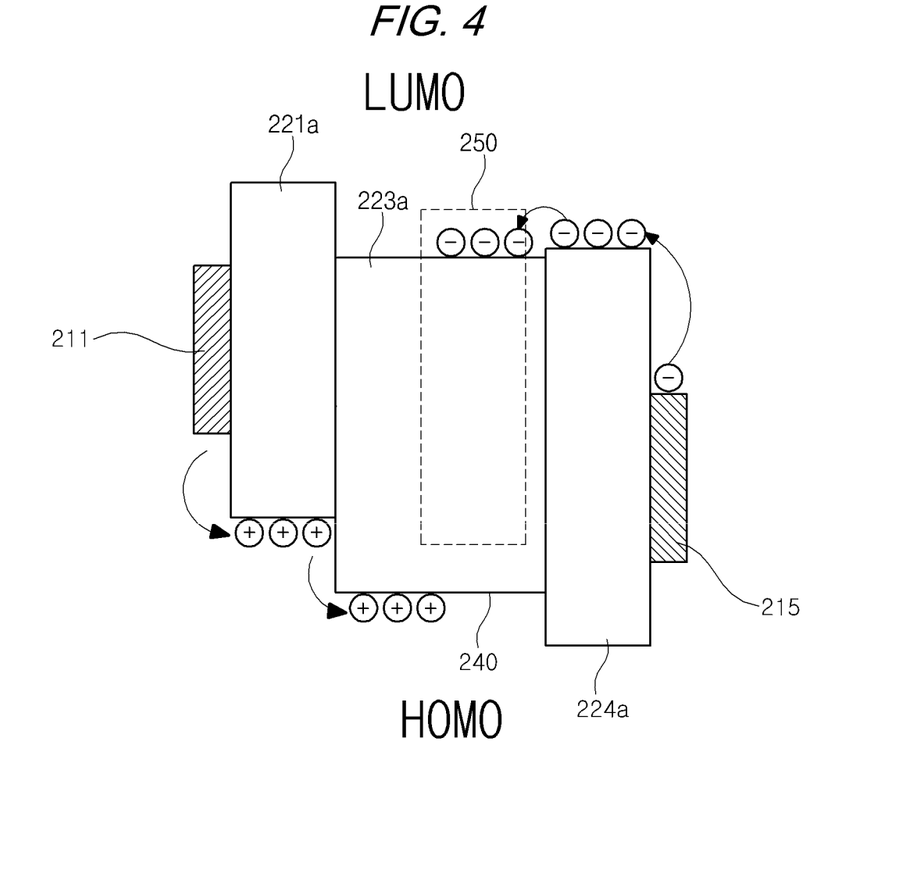
FIG. 4 is an energy band diagram showing an organic light emitting diode according to a first embodiment of the present invention.

Referring to FIG. 4, a lowest unoccupied molecular orbital (LUMO) of the fluorescent dopant 250 of the first EML 223a has an energy level higher than an energy level of an LUMO of the host 240 of the first EML 223a. In the first EML 223a, since the energy level of the LUMO of the dopant 250 is higher than the energy level of the LUMO of the host 240, the hole and the electron are prevented from being trapped in the dopant 250.

When the energy levels of the LUMO and a highest occupied molecular orbital (HOMO) of the dopant are between the energy levels of the LUMO and the HOMO of the host, the hole and the electron may be injected directly into the dopant of the first EML 223a with a high probability. As a result, an amount of the hole and electron injected into the host is reduced and the luminous efficiency is reduced. Further, the dopant may be deteriorated.

To avoid the above disadvantages in the OLED display device, the first EML 223a is formed such that the energy level of the LUMO of the dopant 250 is higher than the energy level of the LUMO of the host 240, thereby the luminous efficiency improved.

FIG. 4 is an energy band diagram showing an organic light emitting diode according to a first embodiment of the present invention. For convenience of illustration, the first stack from FIG. 3 is shown but the second stack from FIG. 3 is omitted in FIG. 4.

In FIG. 4, the first EML 223a includes a single host 240 with a fluorescent dopant 250. A hole is injected from the first HTL 221a into the first EML 223a and an electron is injected from the first ETL 224a into the first EML 223a. After the hole and the electron form an exciton, a light corresponding to an energy difference between an excited state and a ground state is emitted as a visible ray when the exciton transitions from the excited state to the ground state.

Since an energy level of a LUMO of the dopant 250 of the first EML 223a is higher than an energy level of a LUMO of the host 240 of the first EML 223a, all or most of the hole from the first HTL 221a and the electron from the first ETL 224a can be injected into the host 240. Accordingly, all or most of the hole and the electron from the first HTL 221a and the first ETL 224a can form the exciton without loss in the host 240, and the luminous efficiency of the first EML 223a is improved. In other word, since the amounts of the hole and the electron injected into the host 240 increase, a generation efficiency of the singlet state exciton increases, and an amount of the triplet state exciton that causes triplet-triplet annihilation (TTA) increases. In addition, since the hole and the electron are not injected into the dopant 250, deterioration of the dopant 250 can be prevented. For example, the energy level of the LUMO of the dopant 250 may be higher than the energy level of the LUMO of the host 240 by about 0.001 eV to about 0.5 eV or by about 0.01 eV to about 0.5 eV.

Figure 5A:
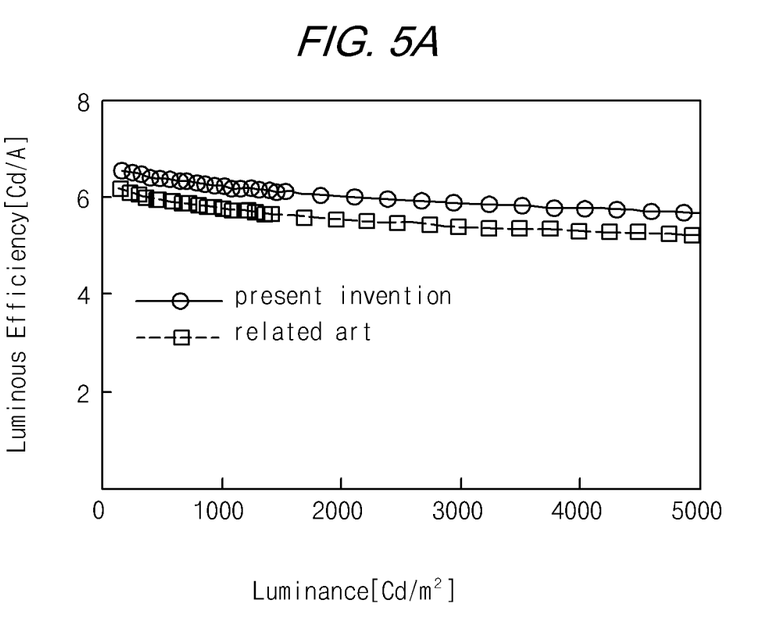
FIGS. 5A and 5B are graphs showing a luminous efficiency and a lifespan, respectively, of an organic light emitting diode according to a first embodiment of the present invention.
Figure 5B:
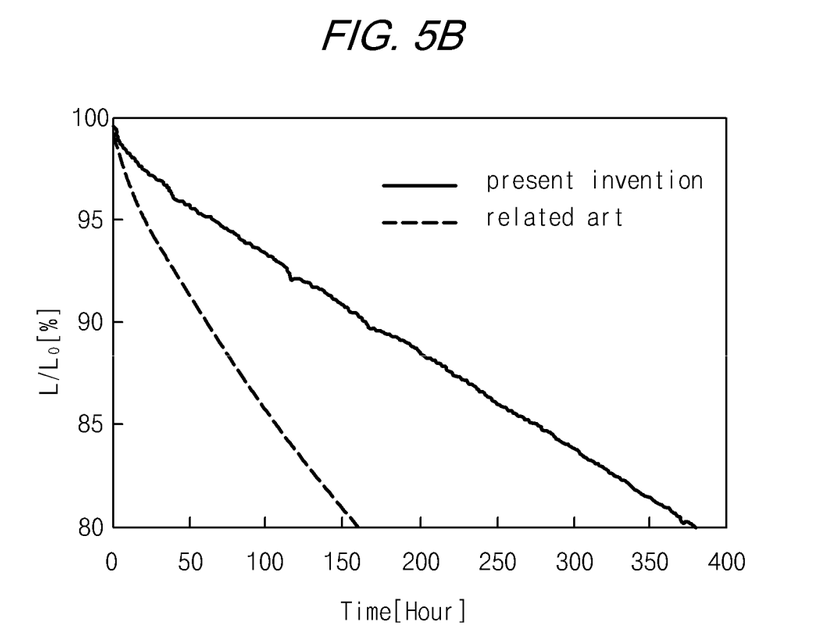

FIGS. 5A and 5B are graphs showing a luminous efficiency and a lifespan, respectively, of an organic light emitting diode according to a first embodiment of the present invention.

In FIG. 5A, the luminous efficiency of the OLED according to the first embodiment of the present invention where the LUMO energy level of the dopant is higher than the LUMO energy level of the host is higher than the luminous efficiency of the OLED according to the related art where each of the LUMO and HOMO energy levels of the dopant is disposed between the LUMO and HOMO energy levels of the host. In FIG. 5B, the lifespan of the OLED according to the first embodiment of the present invention is shown to be longer than twice of the lifespan of the OLED according to the related art. Therefore, the luminous efficiency and the lifespan of the OLED according the first embodiment of the present invention is improved as compared to the OLED according to the related art.

Figure 6:
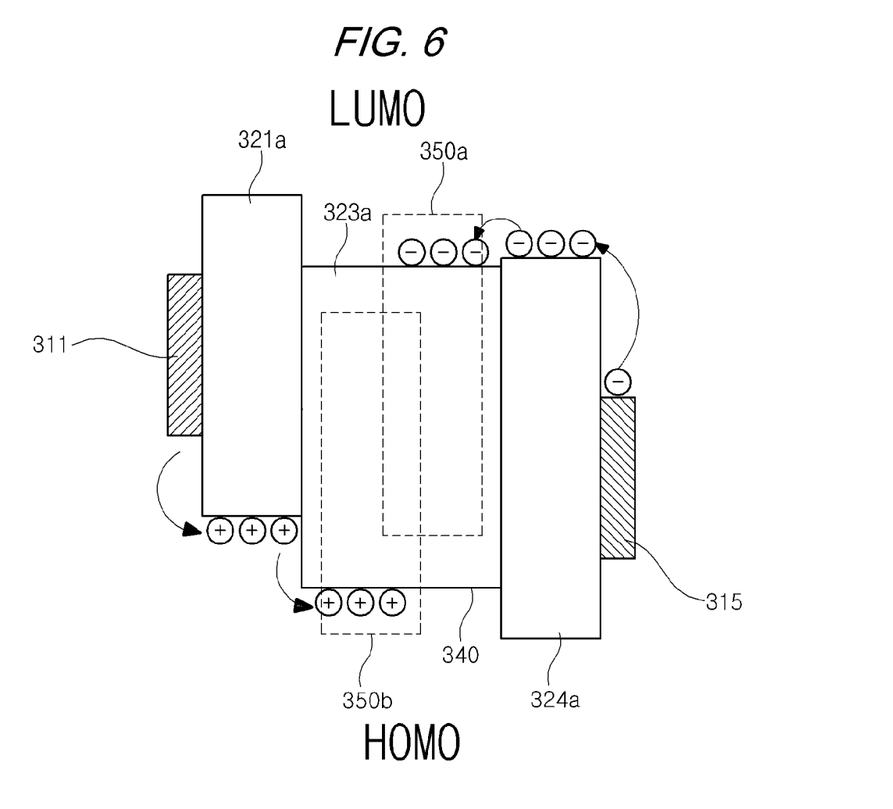
FIG. 6 is an energy band diagram showing an organic light emitting diode according to a second embodiment of the present invention.

FIG. 6 is an energy band diagram showing an organic light emitting diode according to a second embodiment of the present invention.

In FIG. 6, an EML 323a includes a single host 340 with first and second fluorescent dopants 350a and 350b. A hole is injected from an HTL 321a into the EML 323a and an electron is injected from an ETL 324a into the EML 323a. After the hole and the electron form an exciton, a light corresponding to an energy difference between an excited state and a ground state is emitted as a visible ray when the exciton transitions from the excited state to the ground state.

The first dopant 350a is formed to have an energy level of a LUMO higher than an energy level of a LUMO of the host 340, and the second dopant 350b is formed to have an energy level of a HOMO lower than an energy level of a HUMO of the host 340. In addition, one side portion of the EML 323a adjacent to the ETL 324a is doped with the first dopant 350a, and the other side portion of the EML 323a adjacent to the HTL 321a is doped with the second dopant 350b. Items 311 and 315 represent first and second electrodes.

As a result, all or most of the hole from the HTL 321a and the electron from the ETL 324a can be injected into the host 340. Accordingly, all or most of the hole and the electron from the HTL 321a and the ETL 324a may form the exciton without loss in the host 340, and the luminous efficiency of the EML 323a is improved. In addition, since the hole is not injected into the first dopant 350a and the electron is not injected into the second dopant 350b, deterioration of the first and second dopants 350a and 350b is prevented. For example, a difference between band gaps of the first and second dopants 350a and 350b may be smaller than about 0.1 eV. Further, the energy level of the LUMO of the first dopant 350a may be higher than the energy level of the LUMO of the host 340 by about 0.001 eV to about 0.5 eV (or by about 0.01 eV to about 0.5 eV), and the energy level of the HOMO of the second dopant 350b may be lower than the energy level of the HOMO of the host 340 by about 0.001 eV to about 0.5 eV (or by about 0.01 eV to about 0.5 eV).

Figure 7:
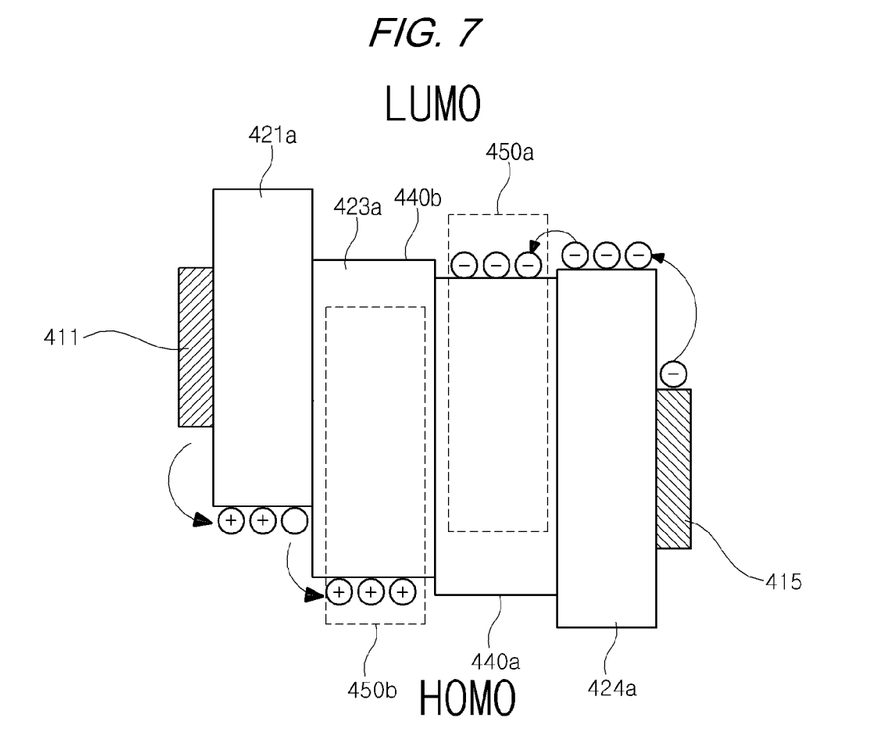
FIG. 7 is an energy band diagram showing an organic light emitting diode according to a third embodiment of the present invention.

FIG. 7 is an energy band diagram showing an organic light emitting diode according to a third embodiment of the present invention.

In FIG. 7, an EML 423a includes first and second host 440a and 440b with first and second fluorescent dopants 450a and 450b. A hole is injected from an HTL 421a into the EML 423a and an electron is injected from an ETL 424a into the EML 423a. After the hole and the electron form an exciton, a light corresponding to an energy difference between an excited state and a ground state is emitted as a visible ray when the exciton transitions from the excited state to the ground state.

The first and second hosts 440a and 440b have different energy levels from each other. In addition, the first dopant 450a is formed to have an energy level of a LUMO higher than an energy level of a LUMO of the first host 440a, and the second dopant 450b is formed to have an energy level of a HOMO lower than an energy level of a HUMO of the second host 440b. Further, one side portion of the EML 423a adjacent to the ETL 424a includes the first host 440a and is doped with the first dopant 450a, and the other side portion of the EML 423a adjacent to the HTL 421a includes the second host 440b and is doped with the second dopant 450b. Items 411 and 415 represent first and second electrodes.

As a result, all or most of the hole from the HTL 421a and the electron from the ETL 424a can be injected into the first and second hosts 440a and 440b. Accordingly, all or most of the hole and the electron from the HTL 421a and the ETL 424a may form the exciton without loss in the first and second hosts 440a and 440b, and the luminous efficiency of the EML 423a is improved. In addition, since the hole is not injected into the first dopant 450a and the electron is not injected into the second dopant 450b, deterioration of the first and second dopants 450a and 450b is prevented. For example, a difference between band gaps of the first and second dopants 450a and 450b may be smaller than about 0.1 eV. Further, the energy level of the LUMO of the first dopant 450a may be higher than the energy level of the LUMO of the first host 440a by about 0.001 eV to about 0.5 eV (or by about 0.01 eV to about 0.5 eV), and the energy level of the HOMO of the second dopant 450b may be lower than the energy level of the HOMO of the second host 440b by about 0.001 eV to about 0.5 eV (or by about 0.01 eV to about 0.5 eV).

The EML of the second and third embodiment may be applied to the second EML 223b of the first embodiment.

Consequently, in an OLED display device, an EML may be formed such that an energy level of a LUMO of a dopant is higher than an energy level of a LUMO of a host. Alternatively, an EML may be formed such that an energy level of a LUMO of a first dopant is higher than an energy level of a LUMO of a host and an energy level of a HOMO of a second dopant is lower than an energy level of a HOMO of the host. Here, one side portion of the EML adjacent to an ETL may be doped with the first dopant, and the other side portion of the EML adjacent to an HTL may be doped with the second dopant. Alternatively, an EML may be formed such that an energy level of a LUMO of a first dopant is higher than an energy level of a LUMO of a first host and an energy level of a HOMO of a second dopant is lower than an energy level of a HOMO of a second host. Here, one side portion of the EML adjacent to an ETL includes the first host and is doped with the first dopant. Further, the other side portion of the EML adjacent to an HTL includes the second host and is doped with the second dopant.

Accordingly, a phenomenon where a hole and an electron are trapped in the dopant can be prevented. In addition, a luminous efficiency of the OLED display device is improved.

It will be apparent to those skilled in the art that various modifications and variations can be made in the organic light emitting diode of the present invention without departing from the sprit or scope of the invention. Thus, it is intended that the present invention covers the modifications and variations of this invention provided they come within the scope of the appended claims and their equivalents.

What is claimed is:

1. An organic light emitting diode, comprising:
    a first electrode;
    a first hole transporting layer on the first electrode;
    a first emitting material layer on the first hole transporting layer, the first emitting material layer comprising a first host with a first dopant, wherein an energy level of a lowest unoccupied molecular orbital of the first dopant is higher than an energy level of a lowest unoccupied molecular orbital of the first host;
    a first electron transporting layer on the first emitting material layer; and
    a second electrode on the first electron transporting layer,
    wherein an energy level of each of the first hole transporting layer and the first electron transporting layer is higher than an energy level of a triplet state exciton of the first emitting material layer,
    wherein the first emitting material layer includes a first side portion adjacent to the first electron transporting layer and a second side portion adjacent to the hole transporting layer, and
    wherein an amount of the first dopant in the first side portion is greater than an amount of the first dopant in the second side portion.

2. The organic light emitting diode according to claim 1, wherein the first dopant comprises a fluorescent dopant.

3. The organic light emitting diode according to claim 2, wherein the fluorescent dopant comprises a blue fluorescent dopant.

4. The organic light emitting diode according to claim 1, further comprising:
- a charge generating layer on the first electron transporting layer;
- a second hole transporting layer on the charge generating layer;
- a second emitting material layer on the second hole transporting layer; and
- a second electron transporting layer on the second emitting material layer,
wherein an energy level of each of the second hole transporting layer and the second electron transporting layer is higher than an energy level of a triplet state exciton of the second emitting material layer.

5. The organic light emitting diode according to claim 4, wherein the second emitting material layer comprises a red dopant and a green dopant.

6. The organic light emitting diode according to claim 4, wherein the second emitting material layer comprises a yellow dopant.

7. The organic light emitting diode according to claim 4, wherein
the energy level of each of the first hole transporting layer and the first electron transporting layer is higher than the energy level of the triplet state exciton of the first emitting material layer by about 0.001eV to about 0.5eV, and
the energy level of each of the second hole transporting layer and the second electron transporting layer is higher than the energy level of the triplet state exciton of the second emitting material layer by about 0.001eV to about 0.5eV.

8. The organic light emitting diode according to claim 4, further comprising an exciton blocking layer between the second hole transporting layer and the second emitting material layer.

9. The organic light emitting diode according to claim 1, wherein the energy level of the lowest unoccupied molecular orbital of the first dopant is higher than the energy level of the lowest unoccupied molecular orbital of the first host by about 0.001eV to about 0.5eV.

10. The organic light emitting diode according to claim 1, wherein
the first light emitting layer further comprises a second dopant, and
an energy level of a highest occupied molecular orbital of the second dopant is lower than an energy level of a highest occupied molecular orbital of the first host.

11. The organic light emitting diode according to claim 10, wherein the first side portion is doped with the first dopant.

12. The organic light emitting diode according to claim 11, wherein the second side portion is doped with the second dopant, and an amount of the second dopant in second side portion is greater than an amount of the second dopant in the first side portion.

13. The organic light emitting diode according to claim 10, wherein a difference of band gaps between the first and second dopants is smaller than about 0.1eV.

14. The organic light emitting diode according to claim 1, wherein
the first emitting material layer further comprises a second host with a second dopant, and
an energy level of a highest occupied molecular orbital of the second dopant is lower than an energy level of a highest occupied molecular orbital of the second host.

15. The organic light emitting diode according to claim 14, wherein the first and second hosts are disposed in the first and second side portions, respectively.

16. The organic light emitting diode according to claim 15, wherein the second side portion is doped with the second dopant and an amount of the second dopant in second side portion is greater than an amount of the second dopant in the first side portion.

17. The organic light emitting diode according to claim 14, wherein a difference of band gaps between the first and second dopants is smaller than about 0.1eV.

* * * * *